(12) United States Patent  (10) Patent No.: US 9,075,275 B2
Guo  (45) Date of Patent: Jul. 7, 2015

(54) ARRAY SUBSTRATE, DISPLAY DEVICE AND MANUFACTURING METHOD OF THE ARRAY SUBSTRATE

(71) Applicant: Beijing BOE Optoelectronics Technology Co., Ltd., Beijing (CN)

(72) Inventor: Jian Guo, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 144 days.

(21) Appl. No.: 13/952,953

(22) Filed: Jul. 29, 2013

(65) Prior Publication Data

US 2014/0042464 A1 Feb. 13, 2014

(30) Foreign Application Priority Data

Aug. 13, 2012 (CN) .......................... 2012 1 0287714

(51) Int. Cl.
*H01L 33/00* (2010.01)
*G02F 1/1362* (2006.01)
*H01L 27/12* (2006.01)

(52) U.S. Cl.
CPC ........ *G02F 1/136209* (2013.01); *H01L 33/005* (2013.01); *H01L 27/1218* (2013.01)

(58) Field of Classification Search
CPC ..................................................... H01L 33/005
See application file for complete search history.

(56) References Cited

U.S. PATENT DOCUMENTS

| 2002/0044238 | A1* | 4/2002 | Lee | 349/110 |
| 2004/0135939 | A1 | 7/2004 | Luo | |
| 2009/0075074 | A1* | 3/2009 | Horio et al. | 428/341 |
| 2013/0215514 | A1* | 8/2013 | Kim et al. | 359/601 |

FOREIGN PATENT DOCUMENTS

CN 102468243 A 5/2012

OTHER PUBLICATIONS

English abstract of CN102468243A, 1 page.
First Office Action issued by the Chinese Patent Office for Chinese Patent Application No. 201210287714.6 dated Feb. 11, 2015, five (5) pages.
English translation of First Office Action issued by the Chinese Patent Office for Chinese Patent Application No. 201210287714.6 dated Feb. 11, 2015, four (4) pages.

* cited by examiner

*Primary Examiner* — Lex Malsawma

(57) ABSTRACT

There are provided an array substrate, a display device and a manufacturing method of the array substrate. The array substrate includes: a base substrate; a set of gate lines located over the base substrate; a black matrix that permeates into the base substrate around each of the gate lines. In technical solutions of the invention, the black matrix is located on the array substrate but not located on the color filter substrate, permeates into the base substrate around each gate line, and has a relatively high accuracy of alignment with the array substrate.

18 Claims, 3 Drawing Sheets

ARRAY SUBSTRATE, DISPLAY DEVICE AND MANUFACTURING METHOD OF THE ARRAY SUBSTRATE

CROSS REFERENCE TO RELATED APPLICATIONS

This application claims priority from Chinese National Application No. 201210287714.6, filed on Aug. 13, 2012, the contents of which are incorporated herein by reference.

BACKGROUND

Embodiments of the present invention relate to an array substrate, a display device and a manufacturing method of the array substrate.

Among flat panel display devices, Thin Film Transistor Liquid Crystal Displays (TFT-LCDs) have features of small volume, low power consumption, relatively low production cost, no irradiation, etc., and play a leading role in the current market for flat panel displays.

Currently, the main structure of a TFT-LCD comprises an array substrate and a color filter substrate that are cell-assembled together. Where, the color filter substrate basically includes: a glass substrate, a Black Matrix (briefly called as "BM"), color filters and a protective film. The chief function of the black matrix is to block stray lights, thereby preventing light leakage between pixels; and the chief function of the color filters is that, three primary colors of red, green and blue are generated by means of light filtering and then mixed in different strength ratios, and thereby, a variety of colors are rendered to make the TFT-LCD shown in full color.

As regards an existing manufacturing process of the TFT-LCD, when the array substrate and the color filter substrate are cell-assembled, there is a certain deviation in alignment between the black matrix of the color filter substrate and pixels of the array substrate owing to existence of an error on the cell-assembling process, so that regions that need to be sheltered may not be covered by the black matrix fully. Thus, it is extremely easy to bring about a phenomenon of light leakage between pixels.

SUMMARY

One of objects of the invention is to provide an array substrate, a display device and a manufacturing method of the array substrate, for enhancing the alignment accuracy between a black matrix and the array substrate and avoiding a phenomenon of light leakage between pixels.

According to an embodiment of the invention, there is provided an array substrate, comprising:

a base substrate;

a set of gate lines located over the base substrate;

a black matrix that permeates into the base substrate around each of the gate lines.

According to another embodiment of the invention, there is provided a display device, comprising the array substrate according to any embodiment of the invention.

According to still another embodiment of the invention, there is provided a manufacturing method of an array substrate, comprising:

forming a gate line metal layer and a photosensitive resin layer on a base substrate in sequence;

performing exposure and development on the photosensitive resin layer, so as to form pattern of a first etch protective mask corresponding to pattern of gate lines;

conducting etching on the gate line metal layer with the first etch protective mask as a mask, so as to form pattern of the gate lines;

performing a first baking on the substrate on which the gate lines are formed until the first etch protective mask covers the gate lines and their surroundings after it flows, and then performing a second baking on it, until a portion of the first etch protective mask that is located around each of the gate lines permeates into the base substrate;

removing a portion of the first etch protective mask that does not permeate into the base substrate on the substrate subjected to the first baking and the second baking, so as to form pattern of a black matrix.

In technical solutions of the invention, the black matrix is located on the array substrate but not located on the color filter substrate, permeates into the base substrate around each gate line, and has a relatively high accuracy of alignment with the array substrate. Thus, a phenomenon of light leakage between pixels can be avoided, and it is no longer required to provide a black matrix on the color filter substrate, either.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) into the scope sought for protection by the invention.

For the sake of enhancing the alignment accuracy between a black matrix and an array substrate and avoiding a phenomenon of light leakage between pixels, embodiments of the invention provide an array substrate, a display device and a manufacturing method of the array substrate.

In the array substrate provided by embodiments of the invention, a black matrix is located on the array substrate but not located on a color filter substrate, and permeates into a base substrate around each gate line. In accordance with embodiments of the invention, the alignment accuracy between the black matrix and the array substrate is relatively high, and thus a phenomenon of light leakage between pixels can be avoided. It is no longer required to provide a black matrix on the color filter substrate, either. Hereinafter, detailed descriptions will be made with reference to specific embodiments and in conjunction with accompanies drawings.

Figure 1:
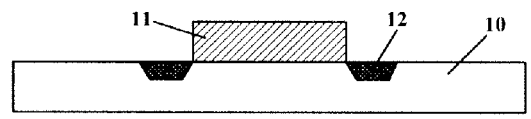
FIG. 1 is a structurally schematic view showing a first embodiment of an array substrate according to the invention.

As shown in FIG. 1, an array substrate according to an embodiment of the invention includes:

a base substrate 10;

a set of gate lines 11 located over the base substrate 10;

a black matrix 12 which permeates into the base substrate around each of the gate lines 11.

As can be seen from FIG. 1, the black matrix 12 is formed directly on the array substrate, and permeates into the base substrate 10 around each of the gate lines 11. The gate lines 11 serve to define pixel regions, and the black matrix 12 has a higher accuracy of alignment with the gate lines, namely, a higher accuracy of alignment with pixels, and so, it is no longer required to provide a black matrix at the location corresponding to the gate lines on a color filter substrate. When the color filter substrate is cell-assembled with the array substrate, an alignment deviation between the black matrix and pixels of the array substrate owing to an error on the cell-assembling process does not exist, either, so that a phenomenon of light leakage between pixels can be avoided and display quality of the display device is raised. Further, at the design stage, it is not necessary that the area of the black matrix need to be increased in consideration of an issue in connection with the alignment accuracy of a cell-assembling apparatus, so that the design redundancy can be raised, and the opening ratio is increased.

Figure 2:
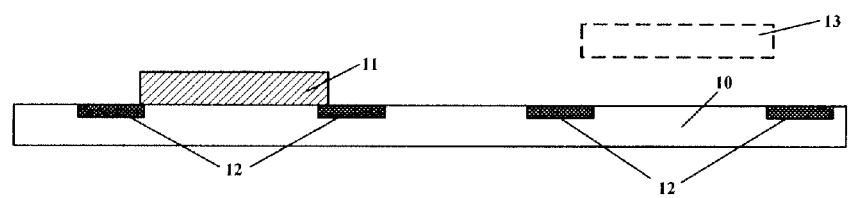
FIG. 2 is a structurally schematic view showing a second embodiment of the array substrate according to the invention.
Figure 4A:
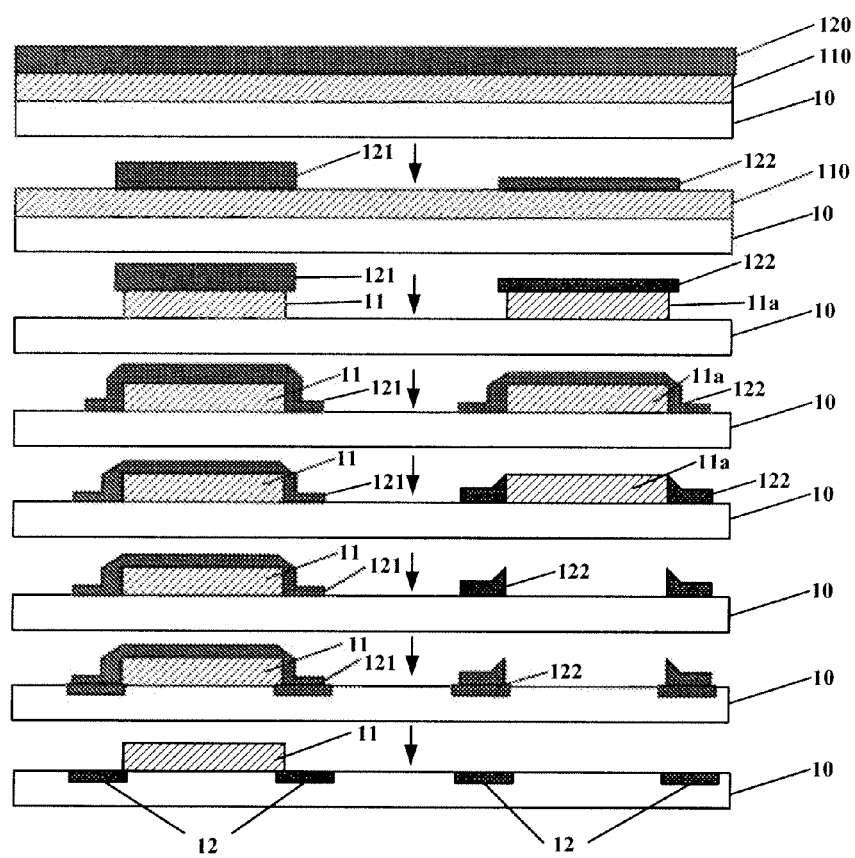
FIG. 4a is a structurally schematic view showing a manufacturing process for the second embodiment of the array substrate according to the invention.
Figure 4B:
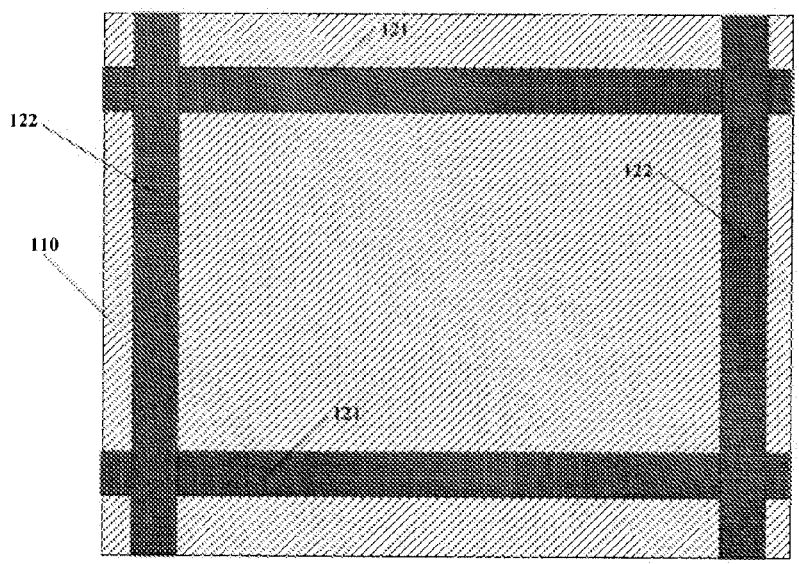
FIG. 4b is a top view after a first etch protective mask and a second etch protective mask are formed in the second embodiment of the manufacturing method according to the invention.

As shown in FIG. 2, an array substrate according to another embodiment of the invention further includes: a set of data lines 13 that is located over a base substrate 10 and is arranged to cross with a set of gate lines 11 (FIG. 2 is merely a schematic view showing the cross-sectional structure, the arrangement manner of the data lines 13 and the gate lines 11 can be obtained by referring to FIG. 4b, and the data lines 13 and the gate lines 11 are laid across each other on different levels, and may be separated from each other by a gate insulating layer). The black matrix 12 permeates into the base substrate 10 around each of the data lines 13. As such, the black matrix permeates into the base substrate both around each of the gate lines and around each of the data lines, and the black matrix takes on the shape of a rectangular mesh as a whole, so that an effect of blocking stray lights is strengthened further. In this way, it is no longer required to provide a black matrix on a color filter substrate. When the color filter substrate is cell-assembled with the array substrate, an alignment deviation between the black matrix and pixels of the array substrate owing to an error on the cell-assembling process does not exist, either, so that a phenomenon of light leakage between pixels can be avoided and display quality of the display device is raised. Further, at the design stage, it is not necessary that the area of the black matrix need to be increased in consideration of an issue in connection with the alignment accuracy of a cell-assembling apparatus, so that the design redundancy can be raised, and the opening ratio is increased.

It is to be noted that, as data lines and gate lines cross with each other at different levels under general circumstances, they might not be present in the same cross section. In FIG. 2, they are drawn in the same cross section merely for illustrative convenience. As for specific, planar configurations of the data lines 13 and the gate lines 11, reference may be made to a first etch mask 121 and a second etch mask 122 that correspond to them in FIG. 4b.

There is no limit on material of the gate lines 11 and the data lines 13, which, for example, are monolayer films of an aluminum-neodymium alloy (AlNd), aluminum (Al), copper (Cu), molybdenum (Mo), an molybdenum-tungsten alloy (MoW) or chromium (Cr), and may also be composite films consisting of any combination of these metallic materials.

There is no limit on materials of the black matrix 12 and the base substrate 10, as long as the material of the black matrix can create an osmosis reaction with the material of the base substrate under certain conditions so that the black matrix permeates into the base substrate. For example, a photosensitive resin containing carbon black material may be selected as the material of the black matrix 12, and a transparent glass, a transparent resin, or the like may be selected as the material of the base substrate 10.

According to an embodiment of the invention, there is further provided a display device, comprising the array substrate shown in either embodiment of FIG. 1 or FIG. 2, so that a phenomenon of light leakage between pixels is improved remarkably, and the display quality is promoted greatly.

There is no limit on the type of the display device, and the type may be a TN (Twisted Nematic) mode, a VA (Vertical Alignment) mode, an IPS (In-Plane Switching) mode, a FFS (Fringe Field Switching) mode or the like, for example. The display device according to the invention may also be an OGS (One Glass Solution) display device, which is capable of meeting a requirement for ultra thinning of intelligent terminals better and promoting the display effect further.

Specifically, the display device may be: a liquid crystal panel, an electronic paper, an OLED panel, a liquid crystal television, a liquid crystal display, a digital photo frame, a cell phone, a tablet computer, or a product or component having any display function.

Figure 3:
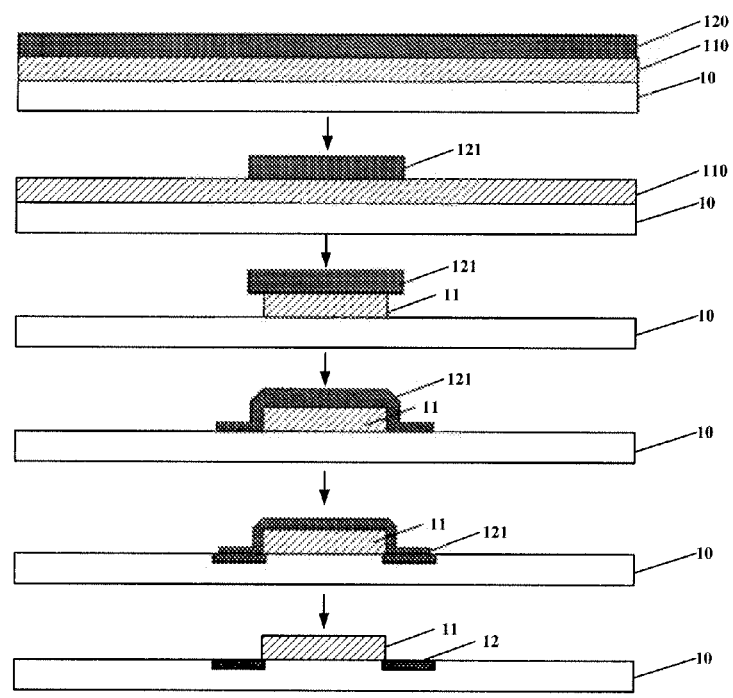
FIG. 3 is a structurally schematic view showing a manufacturing process for the first embodiment of the array substrate according to the invention.

As shown in FIG. 3, a manufacturing method of an array substrate according to an embodiment of the invention includes:

Step 101, a gate-line metal layer 110 and a photosensitive resin layer 120 are formed on a base substrate 10 in sequence.

For example, firstly, the gate-line metal layer 110 is formed on the base substrate 10 by way of magnetron sputtering, thermal evaporation, printing, or the like, and then, the photosensitive resin layer 120 is formed on the gate-line metal layer 110 by way of chemical vapor deposition, coating, printing, or the like. One function of the photosensitive resin layer in this method is to form a protective mask upon subsequent etching in place of photoresist.

Step 102, after exposure and development are conducted on the substrate subjected to the step 101, pattern of a first etch protective mask 121 corresponding to pattern of gate lines is formed.

Step 103, the substrate subjected to the step 102 is etched, so as to form pattern of gate lines 11.

The gate lines 11 are of a metallic material, and the pattern is usually formed by using wet etching. Because of the particularity of the wet etching process, after etching, pattern of the gate lines 11 and pattern of the first etch protective mask 121 will not overlap fully, but pattern of the first etch protective mask 121 extends beyond pattern of the gate lines 11 slightly.

Step 104, the substrate subjected to the step 103 is sent into a high-temperature baking chamber, so as to conduct a first baking on the substrate.

At first, the substrate subjected to the step 103 is sent into a high-temperature reaction chamber at a temperature larger than 150 degrees centigrade, until a flow phenomenon happens to the first etch protective mask 121 on the substrate and it covers the whole of a gate line 11.

After that, the temperature of the high-temperature reaction chamber is adjusted to be 500 degrees centigrade or more, so that a second baking is performed on the substrate, until a portion of the first etch protective mask 121 located around each of the gate lines 11 permeates into the base substrate 10. The functioning principle about this is: the material (photosensitive resin) of the first etch protective mask 121 and the material (glass) of the base substrate 10 each have a crystalline structure, and at a high temperature larger than 500 degrees centigrade, an osmosis phenomenon will be produced in a portion where they contact with each other; while the material of the gate lines 11 is a metal, and it is hard for the osmosis phenomenon to occur between it and the first etch protective mask 121, whereby only the portion of the first etch protective mask 121 located around each of the gate lines 11 permeates into the base substrate 10.

Step 105, a portion of the first etch protective mask 121, which does not permeate into the base substrate 10, on the substrate subjected to the step 104 is removed, so as to form pattern of the black matrix.

For example, after the step 104, the photosensitive resin located around the gate lines 11 has permeated into the base substrate 10, and the photosensitive resin that does not permeate into the base substrate 10 is removed through a stripping or ashing process, so that patterns of the gate lines 11 and the black matrix 12 around the gate lines are finally formed.

As can be seen from the above steps, a portion of the first etch protective mask located around the gate lines is caused to permeate into the base substrate with the help of a high-temperature osmosis reaction of the crystalline structure according to embodiments of the invention. The gate lines serve to define pixel regions, and the black matrix has a higher accuracy of alignment with the gate lines, namely, a higher accuracy of alignment with pixels, thereby attaining a good effect of light blocking. Furthermore, it is no longer required to provide a black matrix at the location corresponding to the gate lines on a color filter substrate. When the color filter substrate is cell-assembled with the array substrate, an alignment deviation between the black matrix and pixels of the array substrate owing to an error on the cell-assembling process does not exist, either, so that a phenomenon of light leakage between pixels can be avoided and display quality of the display device is raised. Further, at the design stage, it is not necessary that the area of the black matrix need to be increased in consideration of an issue in connection with the alignment accuracy of a cell-assembling apparatus, so that the design redundancy can be raised, and the opening ratio is increased.

A manufacturing method of an array substrate according to another embodiment that is shown in FIG. 4a and FIG. 4b comprises:

Step 201, a gate-line metal layer 110 and a photosensitive resin layer 120 are formed on a base substrate 10 in sequence.

As for the specific steps, reference may be made to the step 101 in the above embodiment.

Step 202, after exposure and development are performed on the substrate subjected to the step 201 with a double-tone mask, pattern of a first etch protective mask 121 that is unexposed and corresponds to pattern of gate lines, and pattern of a second etch protective mask 122 that is partially exposed and corresponds to pattern of data lines are formed. Regarding the structure viewed from the top after this step, please refer to FIG. 4b.

Step 203, the substrate subjected to the step 202 is etched, so as to form pattern of gate lines 11 and pattern of a gate-line metal 11a that corresponds to pattern of data lines.

Step 204, a first baking is conducted on the substrate subjected to the step 203, until the first etch protective mask 121 covers the gate lines 11 after it flows, and the second etch protective mask 122 covers the gate-line metal 11a after it flows. The baking temperature is larger than 150 degrees centigrade.

Step 205, an ashing is performed on the substrate subjected to the step 204, so that a portion of the second etch protective mask 122 that is located over the gate-line metal 11a is removed and the gate-line metal 11a is exposed.

Step 206, an etching is conducted on the substrate subjected to the step 205, so as to remove the gate-line metal 11a.

For example, it is possible that this step is implemented by using a wet etching process with reference to existing parameters of gate-line metal etching.

Step 207, a second baking is performed on the substrate subjected to the step 206, until a portion of the first etch protective mask 121 that is located around each of the gate lines 11 permeates into the base substrate 10, and a residual portion of the second etch protective mask 122 permeates into the base substrate 10. The baking temperature is larger than 500 degrees centigrade.

Specifically, the substrate is baked, until a part of photosensitive resin, which is located around each of the gate lines 11, for the first etch protective mask 121 permeates into the base substrate 10, and photosensitive resin in the residual portion of the second etch protective mask 122 permeates into the base substrate 10. The functioning principle about this is: the material (photosensitive resin) of the first etch protective mask 121 and the material (glass) of the base substrate 10 each have a crystalline structure, and at a high temperature larger than 500 degrees centigrade, an osmosis phenomenon will be produced in a portion where they contact with each other; while the material of the gate lines 11 is a metal, and it is hard for the osmosis phenomenon to occur between it and the first etch protective mask 121, whereby only the portion of the first etch protective mask 121 located around each of the gate lines 11 permeates into the base substrate 10.

Step 208, with respect to the substrate subjected to the step 207, a portion of the first etch protective mask 121 that does not permeate into the base substrate 10 and a portion the second etch protective mask 122 in the residual portion thereof that does not permeate into the base substrate 10 are removed, so as to form pattern of a black matrix 12.

In addition, in FIG. 4a, for illustrative convenience, a location where the gate lines are formed (the location corresponding to the protective mask 121) and a location where the data lines are formed (the location corresponding to the protective mask 122) are shown in the same cross-sectional view. However, as shown in FIG. 4b, the gate lines and the data lines should be laid across each other, rather than parallel to each other. Pixel regions are defined by the crossed gate lines and data lines. Further, this method may further include a step of forming data lines at the location of the gate-line metal 11a (corresponding to a location where the data lines are to be formed).

Optionally, it is also possible that the second baking is performed after the first baking and before the ashing of the photosensitive resin layer.

Additionally, in the methods described in Embodiments 2 and 3, regarding materials required by various components and so on, reference may be made to corresponding components in Embodiment 1.

The black matrix formed by the embodiment permeates into the base substrate both around each of the gate lines and around each of the data lines, and the black matrix takes on the shape of a rectangular mesh as a whole and is aligned with the array substrate accurately, so that an effect of blocking stray lights is strengthened further. In this way, it is no longer required to provide a black matrix on a color filter substrate. When the color filter substrate is cell-assembled with the array substrate, an alignment deviation between the black matrix and pixels of the array substrate owing to an error on the cell-assembling process does not exist, either, so that a phenomenon of light leakage between pixels can be avoided and display quality of the display device is raised. Further, at the design stage, it is not necessary that the area of the black matrix need to be increased in consideration of an issue in connection with the alignment accuracy of a cell-assembling apparatus, so that the design redundancy can be raised, and the opening ratio is increased.

Descriptions made above are merely exemplary embodiments of the invention, but are not used to limit the protection scope of the invention. The protection scope of the invention is determined by attached claims.

What is claimed is:

1. An array substrate, comprising:
a base substrate;
a set of gate lines located over the base substrate;
a black matrix that permeates into the base substrate around each of the gate lines.

2. The array substrate according to claim 1, further comprising: a set of data lines, which is located over the base substrate and arranged to cross with the set of gate lines;
wherein the black matrix permeates into the base substrate around each of the data lines.

3. The array substrate according to claim 1, wherein, material of the black matrix is a photosensitive resin, and material of the base substrate is glass.

4. The array substrate according to claim 1, wherein, carbon black material is contained in the photosensitive resin.

5. A display device, comprising the array substrate according to claim 1.

6. The display device according to claim 5, wherein, the display device is a One Glass Solution display device.

7. A manufacturing method of an array substrate, comprising:
forming a gate line metal layer and a photosensitive resin layer on a base substrate in sequence;
performing exposure and development on the photosensitive resin layer, so as to form pattern of a first etch protective mask corresponding to pattern of gate lines;
conducting etching on the gate line metal layer with the first etch protective mask as a mask, so as to form pattern of the gate lines;
performing a first baking on the substrate on which the gate lines are formed until the first etch protective mask covers the gate lines and their surroundings after it flows, and then performing a second baking on it, until a portion of the first etch protective mask that is located around each of the gate lines permeates into the base substrate;
removing a portion of the first etch protective mask that does not permeate into the base substrate on the substrate subjected to the first baking and the second baking, so as to form pattern of a black matrix.

8. The manufacturing method according to claim 7, wherein,
the baking temperature of the first baking is larger than 150 degrees centigrade;
the baking temperature of the second baking is larger than 500 degrees centigrade.

9. The method according to claim 8, further comprising:
forming a second etch protective mask that corresponds to a region where pattern of data lines is to be formed with the use of the photosensitive resin layer simultaneously with formation of the first etch protective mask.

10. The method according to claim 9, wherein, upon the photosensitive resin layer being exposed, a double-tone mask is used, and after the development process is performed, a fully-retained area of the photosensitive resin layer, which corresponds to the first etch protective mask, and a partially-retained area that corresponds to the second etch protective mask are formed, and the photosensitive resin layer in other area is fully removed.

11. The method according to claim 10, wherein, in the step of etching the gate line metal layer, the gate line metal which is located under the second etch protective mask and corresponds to the region where the data lines are to be formed is also retained;
in the first baking, the second etch protective mask also covers the gate metal thereunder and surroundings of the gate metal.

12. The method according to claim 11, further comprising:
conducting ashing on the first etch protective mask and the second etch protective mask after the first baking, so that a portion of the second etch protective mask over the gate line metal is removed to expose the gate line metal under it, and the first etch protective mask is thinned; and
etching off the exposed gate line metal that corresponds to the region where the data lines are to be formed.

13. The method according to claim 12,
wherein, the second baking is performed after etching off of the exposed gate line metal that corresponds to the region where the data lines are to be formed, and in the second baking, a residual portion of the second etch protective mask permeates into the base substrate.

14. The method according to claim 12,
wherein, after the first baking and before the ashing of the first and second etch protective masks, the second baking is performed, until portions of the first and second etch protective masks that are located around the gate line metal thereunder permeate into the base substrate.

15. The method according to claim 13, further comprising:
removing a portion of the second etch protective mask that does not permeated into the base substrate while the portion of the first etch protective mask that does not permeate into the base substrate is removed.

16. The method according to claim 13, further comprising:
forming the data lines in the region where the data lines are to be formed.

17. The method according to claim 7, wherein, carbon black material is contained in the photosensitive resin.

18. The method according to claim 7, wherein, the base substrate is a glass substrate.

* * * * *